(12) United States Patent
Augustino et al.

(10) Patent No.: US 8,603,292 B2
(45) Date of Patent: Dec. 10, 2013

(54) QUARTZ WINDOW FOR A DEGAS CHAMBER

(75) Inventors: Jason Augustino, Livermore, CA (US); Tim Hart, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 675 days.

(21) Appl. No.: 12/607,659

(22) Filed: Oct. 28, 2009

(65) Prior Publication Data

US 2011/0097900 A1    Apr. 28, 2011

(51) Int. Cl.
*C23F 1/00* (2006.01)
*H01L 21/306* (2006.01)

(52) U.S. Cl.
USPC ............... 156/345.1; 156/345.3; 156/345.33; 156/345.34

(58) Field of Classification Search
None
See application file for complete search history.

(56) References Cited

U.S. PATENT DOCUMENTS

| | | | |
|---|---|---|---|
| 3,671,887 A * | 6/1972 | Gibson | 333/143 |
| 3,733,709 A | 5/1973 | Bassemir et al. | |
| 3,819,929 A | 6/1974 | Newman | |
| 3,894,343 A | 7/1975 | Pray et al. | |
| 3,967,385 A | 7/1976 | Culbertson | |
| 4,005,135 A | 1/1977 | Helding | |
| 4,005,138 A | 1/1977 | Plattner et al. | |
| 4,015,340 A | 4/1977 | Treleven | |
| 4,025,795 A | 5/1977 | Lackore et al. | |
| 4,049,987 A | 9/1977 | Helms | |
| 4,568,632 A | 2/1986 | Blum et al. | |
| 5,156,820 A * | 10/1992 | Wong et al. | 422/186.05 |
| 5,262,902 A | 11/1993 | Okumura et al. | |
| 5,470,799 A | 11/1995 | Itoh et al. | |
| 5,534,107 A | 7/1996 | Gray et al. | |
| 5,572,091 A | 11/1996 | Langer et al. | |
| 5,716,495 A | 2/1998 | Butterbaugh et al. | |
| 5,781,693 A | 7/1998 | Ballance et al. | |
| 5,788,940 A | 8/1998 | Cicha et al. | |
| 5,861,633 A | 1/1999 | Mandellos | |
| 5,922,219 A | 7/1999 | Fayfield et al. | |
| 6,012,304 A | 1/2000 | Loxley et al. | |
| 6,015,503 A | 1/2000 | Butterbaugh et al. | |
| 6,015,759 A | 1/2000 | Khan et al. | |
| 6,065,481 A | 5/2000 | Fayfield et al. | |
| 6,108,126 A | 8/2000 | Hagiwara et al. | |

(Continued)

FOREIGN PATENT DOCUMENTS

| | | |
|---|---|---|
| JP | 62-154736 A | 7/1987 |
| JP | 2002-016033 A | 1/2002 |
| KR | 10-0363846 B1 | 11/2002 |

OTHER PUBLICATIONS

International Search Report and Written Opinion dated May 31, 2011 for PCT/US2010/002822.

(Continued)

*Primary Examiner* — Duy Deo
(74) *Attorney, Agent, or Firm* — Buchanan Ingersoll & Rooney PC

(57) ABSTRACT

A five-sided quartz window configured to be mounted on a degas chamber as a UV-transmissive window. The quartz window is made of synthetic quartz and has a uniform thickness. The shape of the quartz window is defined by an upper surface, a lower surface and a sidewall therebetween. The sidewall has five straight sections interconnected by five arcuate sections. The quartz window has four arcuate recesses extending into the sidewall.

9 Claims, 5 Drawing Sheets

(56) References Cited

U.S. PATENT DOCUMENTS

| | | | |
|---|---|---|---|
| 6,156,079 | A | 12/2000 | Ho et al. |
| 6,187,133 | B1 | 2/2001 | Knoot |
| 6,191,428 | B1 | 2/2001 | Gilberti |
| 6,254,689 | B1 | 7/2001 | Meder |
| 6,280,801 | B1 | 8/2001 | Schmitt |
| 6,355,587 | B1 | 3/2002 | Loxley et al. |
| 6,465,374 | B1 | 10/2002 | Butterbaugh et al. |
| 6,465,799 | B1 | 10/2002 | Kimble et al. |
| 6,518,547 | B2 * | 2/2003 | Takahashi et al. ............ 219/390 |
| 6,649,921 | B1 | 11/2003 | Cekic et al. |
| 6,720,566 | B2 | 4/2004 | Blandford |
| 6,797,966 | B2 | 9/2004 | Summers et al. |
| 6,832,844 | B2 | 12/2004 | Guzorek |
| 6,843,202 | B2 | 1/2005 | Kusuda |
| 7,036,957 | B2 | 5/2006 | Paravantsos |
| 7,081,290 | B2 | 7/2006 | Takahashi et al. |
| 7,365,037 | B2 | 4/2008 | Sato et al. |
| 7,566,891 | B2 | 7/2009 | Rocha-Alvarez et al. |
| 7,589,336 | B2 | 9/2009 | Kaszuba et al. |
| 7,789,965 | B2 | 9/2010 | Matsushita et al. |
| 2001/0012604 | A1 | 8/2001 | Okase et al. |
| 2001/0034004 | A1 | 10/2001 | Kitamura |
| 2003/0131783 | A1 * | 7/2003 | Arvidson ........................ 117/13 |
| 2004/0203251 | A1 | 10/2004 | Kawaguchi et al. |
| 2005/0268467 | A1 | 12/2005 | Woods-Hunter |
| 2005/0268567 | A1 | 12/2005 | Devine et al. |
| 2006/0196525 | A1 | 9/2006 | Vrtis et al. |
| 2006/0223315 | A1 * | 10/2006 | Yokota et al. ................. 438/689 |
| 2007/0228618 | A1 | 10/2007 | Kaszuba et al. |
| 2007/0286963 | A1 | 12/2007 | Rocha-Alvarez et al. |
| 2008/0067425 | A1 | 3/2008 | Kaszuba et al. |
| 2008/0143806 | A1 | 6/2008 | Claeys |
| 2009/0045714 | A1 | 2/2009 | Claeys |
| 2009/0065027 | A1 | 3/2009 | Kawamura et al. |
| 2011/0146705 | A1 | 6/2011 | Hart et al. |
| 2011/0306213 | A1 | 12/2011 | Wang et al. |

OTHER PUBLICATIONS

Carriere, L. A. et al., "Economics of Switching Fluorescent Lamps", IEEE Transactions on Industry Applications, vol. 24, No. 3, pp. 370-379, May/Jun. 1988 (IRC Paper No. 1562).

Commonly Assigned U.S. Appl. No. 12/640,910, filed Dec. 17, 2000.

* cited by examiner

QUARTZ WINDOW FOR A DEGAS CHAMBER

BACKGROUND

During plasma processing of semiconductor substrates where the semiconductor substrates are exposed to halogen-containing process gases, a residue of the process gases can remain on the surface of the semiconductor substrates. Such residue can cause defects in the semiconductor substrates in downstream processing steps, and can contaminate other semiconductor substrates in the processing pipeline. Therefore, it is desirable to remove such residue from the semiconductor substrates in a degas chamber.

SUMMARY

Described herein is a five-sided quartz window configured to be mounted on a degas chamber; the quartz window comprising a quartz plate of uniform thickness and having a bottom surface, a top surface and a sidewall extending between the bottom surface and the top surface, wherein the sidewall includes five straight sections interconnected by five arcuate sections.

DETAILED DESCRIPTION

Figure 1:
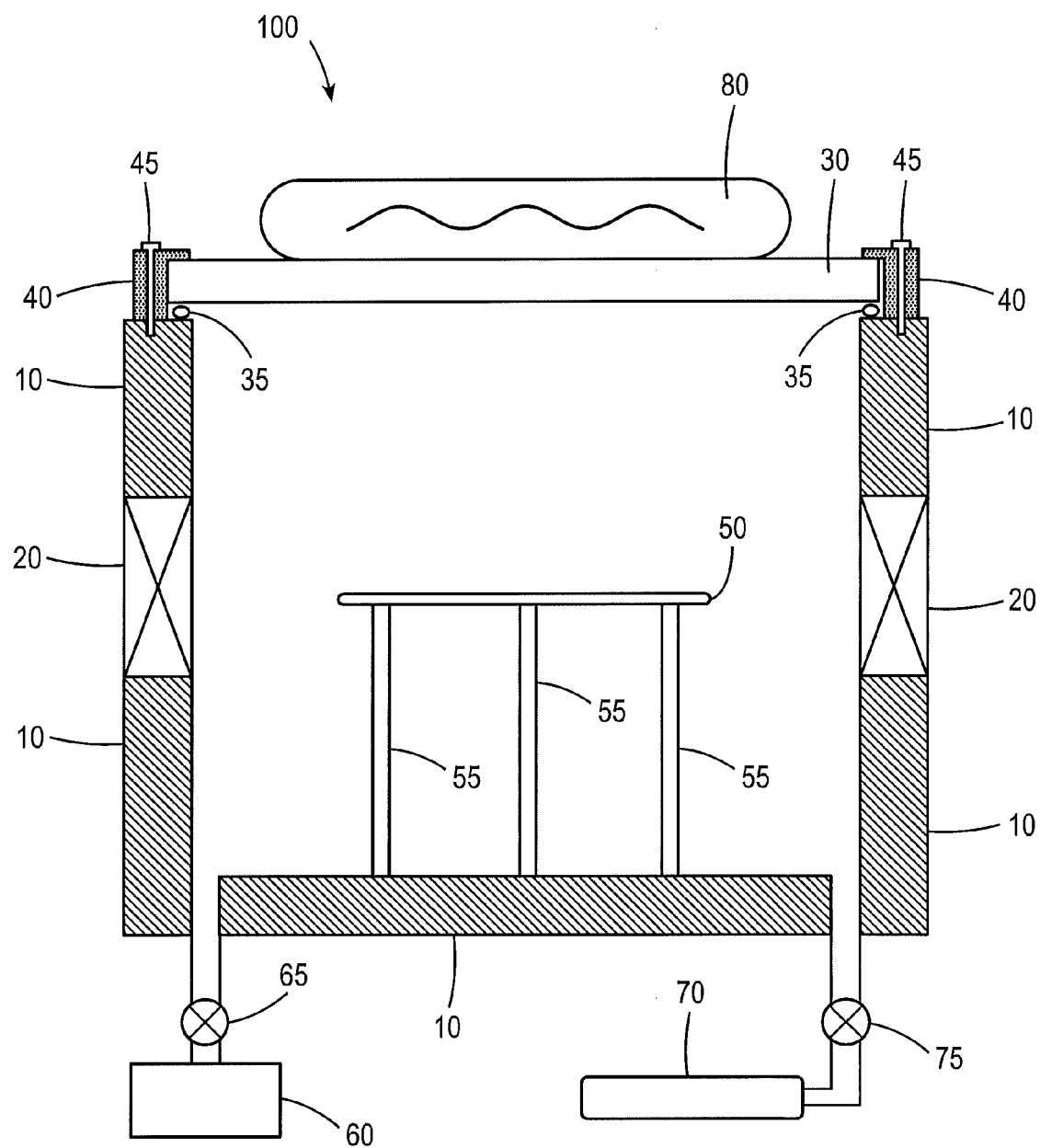
FIG. 1 shows a schematic cross section of a degas chamber.

FIG. 1 shows a schematic cross section of an exemplary degas chamber 100. The degas chamber 100 comprises a chamber wall 10, made of a metallic material such as aluminum. A five-sided quartz window 30 is clamped to a top of the chamber wall 10 by a plurality of clamps 40 45. The quartz window 30 is preferably made of synthetic quartz for its high transmission of UV light. Synthetic quartz is typically untwined and produced in an autoclave via the hydrothermal process. A continuous pentagon-shaped O-ring 35 between the quartz window 30 and the chamber wall 10 provides a vacuum seal. A UV source 80 is disposed above the quartz window 30. A vacuum pump 60 is connected to the degas chamber 100 through an exhaust port which can be closed by a valve 65. A gas source 70 is connected to the degas chamber 100 through a gas line which can be closed by another valve 75.

Figure 2:
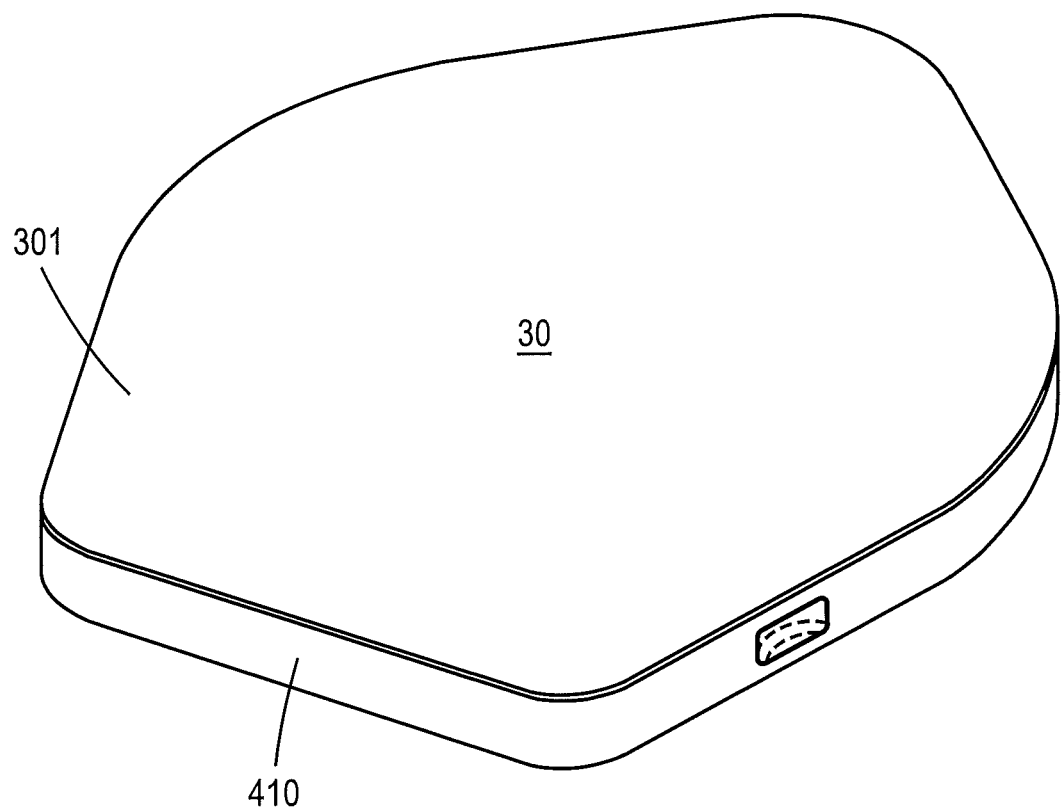
FIG. 2 shows a perspective view of a five-sided quartz window for a degas chamber.

FIG. 2 is a perspective view of an embodiment of the quartz window 30. The quartz window 30 is a five-sided quartz plate with a uniform thickness of about 1.1 to 1.2 inches ("about" as used herein means±10%), preferably about 1.15 inches. A top surface 301 and a bottom surface 302 of the quartz window 30 are mechanically polished, preferably to a roughness with an $R_a$ between 1 microinch and 5 microinches. A sidewall 410 extends between the top surface 301 and the bottom surface 302. When mounted on the degas chamber 100, the quartz window 30 is clamped to the chamber wall 10 by four clamps 40 engaged at four clamping regions 391-394 on the top surface 301 of the quartz window 30.

Figure 3:
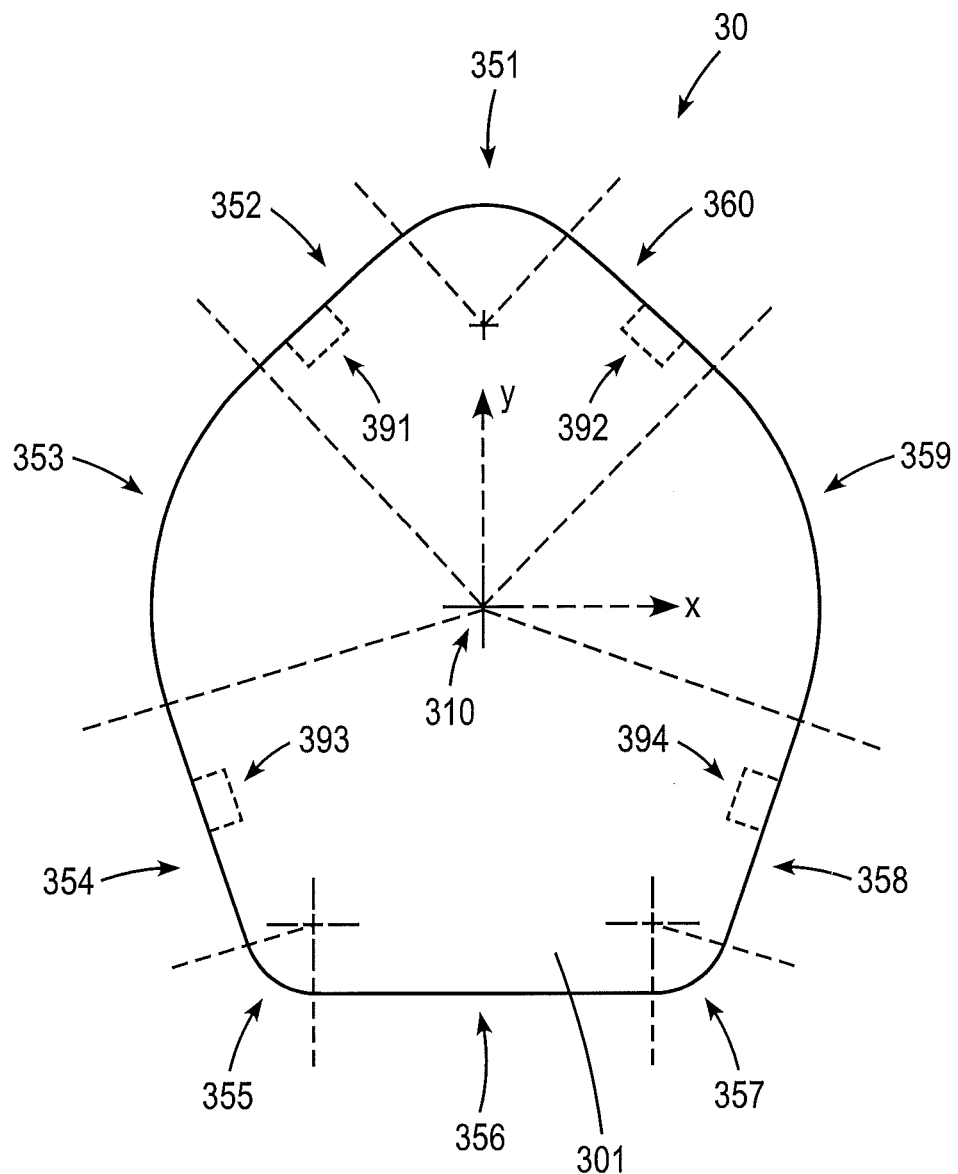
FIG. 3 shows a top view of the quartz window of FIG. 2.

FIG. 3 is a top view of the five-sided quartz window 30. The perimeter of the quartz window 30 is defined by five straight sections (352, 354, 356, 358 and 360) interconnected by five arcuate sections (351, 353, 355, 357 and 359). The quartz window 30 is pentagonal in shape with a straight base section 356, straight lower diverging sections 354, 358 at an angle of about 18.5° with a center line passing perpendicularly through the middle of the base section 356 and dividing the window into two equal parts, and straight upper converging sections 352, 360 at an angle of about 47.2° with the center line with large radius arcuate sections 353, 359 between the upper and lower straight sections and small radius arcuate sections 355, 357 between the straight base section 356 and lower straight sections 354, 358 and another small radius arcuate section between the upper straight sections 352, 360. For simplicity, a Cartesian coordinate system is established to define these sections. All coordinates described herein have a tolerance of ±10% and are in the unit of inches. The origin of the Cartesian coordinate is at a central point as marked by a cross hair 310. The quartz window 30 is symmetric about the y axis. The quartz window 30 has a length of about 15.2 inches along the y axis and a width of about 12.6 inches along the x axis. Thus, the window 30 is slightly larger than a 300 mm (12 inch) diameter wafer.

The section 352 is a straight line between coordinates (−1.58, 7.12) and (−4.29, 4.62). The section 360 is a straight line between coordinates (1.58, 7.12) and (4.29, 4.62). The section 354 is a straight line between coordinates (−5.97, −2.00) and (−4.46, −6.53). The section 358 is a straight line between coordinates (5.97, −2.00) and (4.46, −6.53). The section 356 is a straight line between coordinates (−3.15, −7.47) and (3.15, −7.47). The arcuate section 351 is tangent to both sections 352 and 360 and has a radius of about 2.32 inches with a central angle (the angle between two radii that span the arc) of about 85.7°. The arcuate section 353 is tangent to both sections 352 and 354 and has a radius of about 6.3 inches with a central angle of about 65.7°. The arcuate section 355 is tangent to both sections 354 and 356 and has a radius of about 1.38 inches with a central angle of about 71.5°. The arcuate section 357 is tangent to both sections 356 and 358 and has a radius of about 1.38 inches with a central angle of about 71.5°. The arcuate section 359 is tangent to both sections 358 and 360 and has a radius of about 6.3 inches with a central angle of about 65.7°.

Figure 4:
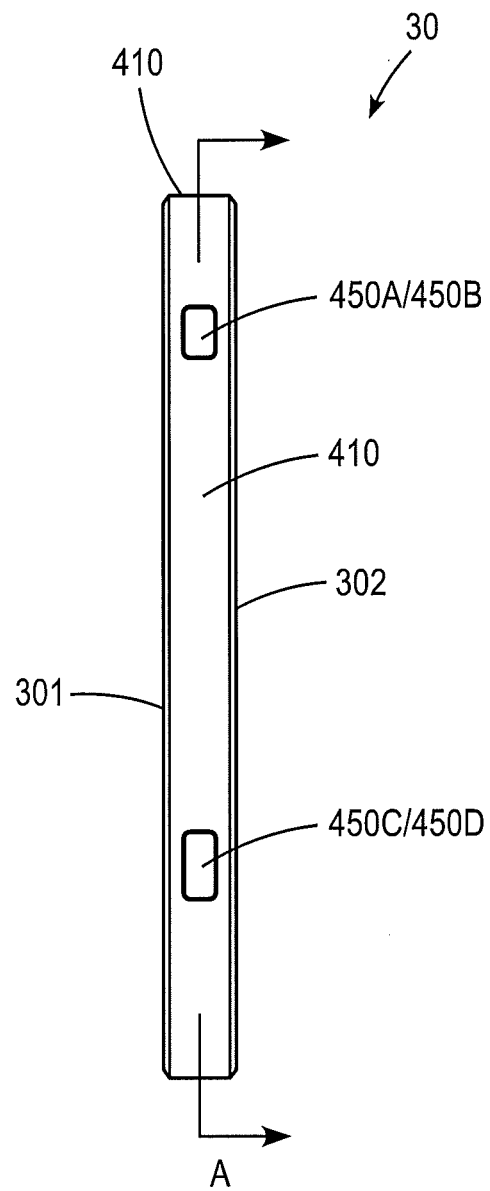
FIG. 4 shows a side view of the quartz window of FIG. 2.

FIG. 4 shows a side view of the quartz window 30 wherein the sidewall 410 extends between the top surface 301 and the bottom surface 302 of the quartz window 30. The window 30 is preferably solid quartz and does not including any protrusions, indentations or passages other than recesses in the sidewall which are used for manual or automatic transport of the window 30. The window 30 is preferably ultra pure synthetic quartz.

Figure 5:
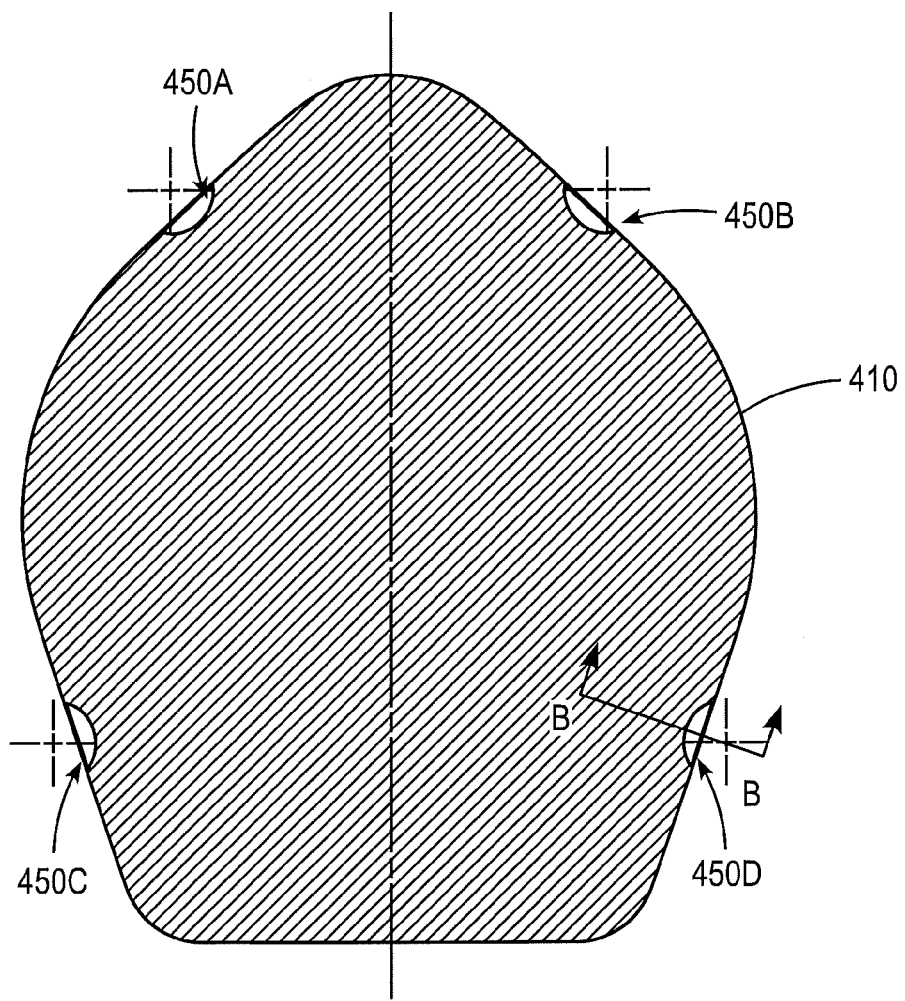
FIG. 5 shows a cross sectional view of the quartz window of FIG. 2.
Figure 6:
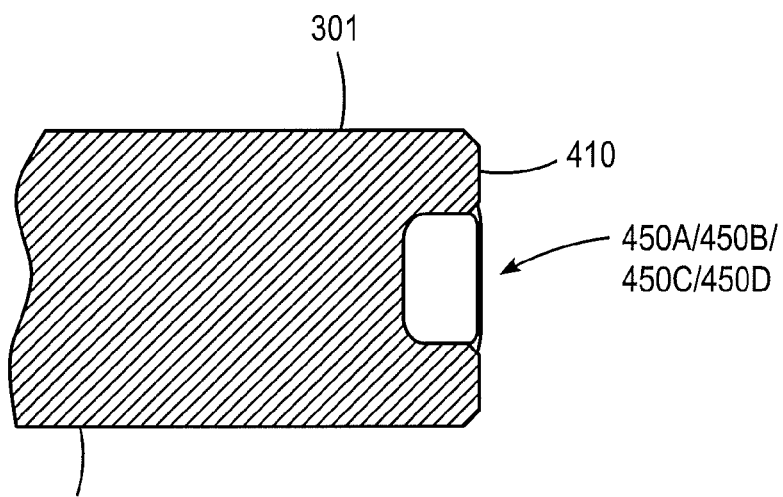
FIG. 6 shows another cross sectional view of the quartz window of FIG. 2.

FIG. 5 shows a cross section along line A-A in FIG. 4. The sidewall 410 has four arcuate recesses 450A, 450B, 450C and 450D on the straight sections 352, 360, 354 and 358 respectively, and configured to engage a lifting tool for installing and uninstalling the quartz window 30. FIG. 6 shows a cross section along line B-B in FIG. 5. Each recess defines an opening of about 1 inch by about 0.5 inch in the sidewall 410, parallel upper and lower walls and a curved vertical wall having a radius of about 0.75 inch and a height of about 0.5 inch between the parallel upper and lower walls. The recesses are located about midway between the top surface 301 and the bottom surface 302. The arcuate centers of the recesses 450A and 450B are located at coordinates (−3.74, 5.74) and (3.74, 5.74), respectively. The arcuate centers of the recesses 450C and 450D are located at coordinates (−5.79, −3.97) and (5.79, −3.97), respectively. The inside corners of the recesses are rounded to a radius of about 0.1 inch. The outside corners of the recesses have a 45° chamfer of about 0.04 inch wide.

The quartz window 30 is configured to be mounted on the top of the degas chamber 100 in which UV light is transmitted through the quartz window 30 while a gas such as ozone or oxygen is flowed in the degas chamber 100 to remove halogen-containing residues such as etch byproducts from a semiconductor substrate such as a 300 mm wafer supported in the degas chamber 100. The quartz window 30 is large enough to allow the gas above an upper surface of the wafer to be irradiated with the UV light and the non-circular shape of the quartz window 30 overlies a slightly smaller opening of the same shape which allows access to interior chamber components that would otherwise be inaccessible if the quartz window 30 were circular and about the size of the semiconductor substrate. Due to the presence of surrounding manometer fittings, gas lines and components of adjacent chambers, the shape of the quartz window 30 also allows the quartz window 30 to be raised and lowered without colliding with such adjacent hardware.

Referring to FIG. 1, during processing in the degas chamber 100, a semiconductor substrate 50 is transferred through a loading door 20 in the chamber wall 10 and placed on a plurality of substrate support pins 55. The degas chamber 100 is evacuated by the vacuum pump 60 and the gas source 70 provides ozone gas or $O_2$ gas into the degas chamber 100 which is maintained at a vacuum pressure between 10 mTorr and 10 Torr. The UV source 80 irradiates through the quartz window 30 towards the semiconductor substrate 50 with a UV light preferably of a wavelength of 254 nm and at an intensity between 0.05 and 5 W/cm$^2$, for a period of between 10 seconds and 1 minute. Ozone gas or $O_2$ gas absorbs UV radiation from the UV light and decomposes into O radicals (atomic oxygen) which react with the halogen-containing residue. The reaction products are gases and are evacuated from the degas chamber 100.

While the quartz window has been described in detail with reference to specific embodiments thereof, it will be apparent to those skilled in the art that various changes and modifications can be made, and equivalents employed, without departing from the scope of the appended claims.

We claim:

1. A degas chamber comprising a quartz window removably mounted on an upper surface of the degas chamber, the quartz window comprising a quartz plate of uniform thickness, the quartz plate comprising a bottom surface, a top surface and a sidewall extending between the bottom surface and the top surface, wherein the sidewall includes five straight sections interconnected by five arcuate sections.

2. The degas chamber of claim 1, wherein the five straight sections and the five arcuate sections consist of a straight base section, two straight lower diverging sections and two straight upper converging sections with two large radius arcuate sections between the upper converging sections and the lower diverging sections and two small radius arcuate sections between the base section and the lower diverging sections and another small radius arcuate section between the upper converging sections.

3. The degas chamber of claim 1, wherein the five straight sections and five arcuate sections include:
  a first arcuate section having a radius of about 2.32 inches and a central angle of about 85.7°;
  a second arcuate section having a radius of about 6.3 inches and a central angle of about 65.7°;
  the third arcuate section having a radius of about 1.38 inches and a central angle of about 71.5°;
  a fourth arcuate section having a radius of about 1.38 inches and a central angle of about 71.5°;
  a fifth arcuate section having a radius of about 6.3 inches and a central angle of about 65.7°;
  a first straight section connected to the first and second arcuate sections;
  a second straight section connected to the second and third arcuate sections;
  a third straight section connected to the third and fourth arcuate sections;
  a fourth straight section connected to the fourth and fifth arcuate sections;
  a fifth straight section connected to the fifth and first arcuate sections; and
  each of the straight sections is tangent to both arcuate sections it is connected to.

4. The degas chamber of claim 1, wherein the thickness of the quartz window is about 1.15 inches and the upper surface has a maximum dimension of about 15.2 inches and a minimum dimension of about 12.6 inches.

5. The degas chamber of claim 1, wherein the top surface and the bottom surface are polished surfaces having a roughness with $R_a$ between 1 and 5 microinches.

6. The degas chamber of claim 1, wherein the quartz is synthetic quartz.

7. A degas chamber of claim 1, wherein the quartz window is removably mounted by a plurality of clamps, and a continuous pentagon-shaped O-ring disposed between the quartz window and the upper surface of the degas chamber to provide a vacuum seal.

8. A five-sided quartz window of a degas chamber, the quartz window comprising a quartz plate of uniform thickness, the quartz plate comprising
  a bottom surface, a top surface and a sidewall extending between the bottom surface and the top surface, wherein the sidewall includes five straight sections interconnected by five arcuate sections, and further comprising four arcuate recesses in the sidewall along the converging and diverging sections, wherein the recesses have parallel upper and lower walls and a curved vertical wall therebetween, the curved vertical wall having a radius of about 0.75 inch and a height between the upper and lower walls of about 0.5 inch, the recesses being located midway between the top surface and the bottom surface.

9. A method of processing a semiconductor substrate, comprising:
  placing the semiconductor substrate into the degas chamber of claim 1;
  supplying ozone gas or $O_2$ gas into the degas chamber while maintaining a vacuum pressure in the chamber of 10 mTorr to 10 Torr;
  generating O radicals by irradiating the ozone gas or $O_2$ gas in the degas chamber through the quartz window with UV light;
  removing halogen-containing residues on the semiconductor substrate by reaction with the O radicals.

* * * * *